(12) United States Patent
Chang

(10) Patent No.: US 7,771,209 B2
(45) Date of Patent: Aug. 10, 2010

(54) ELECTRICAL CONNECTING APPARATUS

(75) Inventor: Wen-Chang Chang, Keelung (TW)

(73) Assignee: Lotes Co., Ltd, Keelung (TW)

( * ) Notice: Subject to any disclaimer, the term of this patent is extended or adjusted under 35 U.S.C. 154(b) by 0 days.

(21) Appl. No.: 12/206,127

(22) Filed: Sep. 8, 2008

(65) Prior Publication Data
US 2010/0062619 A1    Mar. 11, 2010

(51) Int. Cl.
*H01R 12/00* (2006.01)
(52) U.S. Cl. .............................. 439/66; 439/70; 439/83
(58) Field of Classification Search ................... 439/70, 439/71, 83, 66, 733.1, 68, 850, 188
See application file for complete search history.

(56) References Cited

U.S. PATENT DOCUMENTS

| | | | | |
|---|---|---|---|---|
| 4,776,810 | A * | 10/1988 | Cohen et al. ................. | 439/331 |
| 5,071,362 | A * | 12/1991 | Martens et al. .............. | 439/188 |
| 5,073,119 | A * | 12/1991 | Soes ............................ | 439/82 |
| 5,199,885 | A * | 4/1993 | Korsunsky et al. ............ | 439/79 |
| 5,266,043 | A * | 11/1993 | Giroux et al. ................ | 439/188 |
| 5,277,606 | A * | 1/1994 | Giroux et al. ................ | 439/188 |
| 5,374,200 | A * | 12/1994 | Giroux ........................ | 439/188 |
| 5,887,344 | A * | 3/1999 | Sinclair ........................ | 29/843 |
| 6,843,662 | B2 * | 1/2005 | Ju ................................ | 439/83 |
| 7,134,920 | B1 * | 11/2006 | Ju et al. ....................... | 439/691 |
| 7,326,064 | B2 * | 2/2008 | Rathburn et al. .............. | 439/66 |
| 2005/0239301 | A1 * | 10/2005 | Morana et al. ................ | 439/70 |
| 2007/0249240 | A1 * | 10/2007 | Chiang ........................ | 439/850 |

* cited by examiner

Primary Examiner—T C Patel
Assistant Examiner—Harshad C Patel
(74) Attorney, Agent, or Firm—Ming Chow; Sinorica, LLC

(57) ABSTRACT

The electrical connecting apparatus according to the present invention is used for providing electrical contacts for an electronic device and comprises a housing and a plurality of electrical contacts. At least one passageway is set on the housing. At least two ribs are set in the passageways. Within the passageways, at least one holding space is formed between two adjacent ribs. The electrical contacts are set in the passageways, respectively. In addition, portions of at least two electrical contacts are accommodated in the same holding space. The electrical contact has a base portion located underneath the rib. A pair of contact portions is formed by extending upwards from the base portion along corresponding two sides of the rib. Besides, at least one contact portion pass through the holding space. When the paired contact portions of each said electrical contact make contact with the electronic device, the contact portions move away from said rib. When the paired contact portions of each electrical contact of the electrical connecting apparatus according to the present invention make contact with an electronic device, the contact portions move away from said rib. Thereby, the electrical contact does not interfere with the housing. Consequently, the reliability of the product can be guaranteed.

9 Claims, 4 Drawing Sheets

ELECTRICAL CONNECTING APPARATUS

FIELD OF THE INVENTION

The present invention relates to an electrical connecting apparatus.

BACKGROUND OF THE INVENTION

U.S. Pat. No. 6,447,304 discloses an electrical connecting apparatus comprising an insulating housing and a plurality of electrical contacts. The insulating housing has a plurality of passageways perpendicular to the surface of the insulating housing. A support block is set within the passageway. The electrical contact is received within the passageway, and comprises an elastic arm, a contact portion formed by bending and extending upwards from one end of the elastic arm, a connecting portion formed by bending and extending downwards from one end of the contact portion, and a soldering portion formed by extending downwards from one end of the connecting portion. The elastic arm and the connecting portion clip from both sides of the support block, respectively. When the electrical contact makes contact with an electronic device, the contact portion is forced to move downwards and towards the support block. Meanwhile, the elastic arm and the connecting portion press tightly both sides of the support block, respectively, so that the electrical contact interferes with the insulating housing and the normal force on the electrical contact is increased. Thereby, the reliability of the product is affected.

Accordingly, the present invention provides a novel electrical connecting apparatus for solving the problem described above.

SUMMARY

An objective of the present invention is to provide an electrical connecting apparatus, which can reduce normal forces exerted on an electrical contact by means of avoiding interference between the electrical contact and a housing when the electrical contact makes contact with an electronic device.

The electrical connecting apparatus according to the present invention is used for providing electrical contact for an electronic device and comprises a housing and a plurality of electrical contacts. At least one passageway is set on the housing. At least two ribs are set in the passageways. Within the passageways, at least one holding space is formed between two adjacent ribs. The electrical contacts are set in the passageways, respectively. In addition, portions of at least two electrical contacts are accommodated in the same holding space. The electrical contact has a base portion located underneath the rib. A pair of contact portions is formed by extending upwards from the base portion along corresponding two sides of the rib. Besides, at least one contact portion pass through the holding space. When the paired contact portions of each said electrical contact make contact with the electronic device, the contact portions move away from corresponding said rib.

In comparison with the prior art, when the paired contact portions of each electrical contact of the electrical connecting apparatus according to the present invention make contact with an electronic device, the contact portions move away from corresponding said rib. Thereby, the electrical contact does not interfere with the housing and thus reduces the normal forces exerted on the electrical contact due to interference with the housing. Consequently, the reliability of the product can be guaranteed.

The electrical connecting apparatus according to the present invention comprises a housing and a plurality of electrical contacts. At least one passageway is set on the housing. At least two ribs are set in the passageways. The electrical contacts are set in the passageways, respectively. The electrical contact has a base portion located underneath the rib, and a gap is formed between the base portion and the rib. A pair of elastic clip arms is formed by extending upwards from both sides of the base portion. and clips both sides of the rib, respectively. Besides, the inner sides of both ends of said elastic clip arms form a pair of opposite contact surfaces, respectively.

In comparison with the prior art, the base portion of the electrical contact according to the present invention is located underneath the rib, and a gap is formed between the base portion and the rib. A pair of elastic clip arms is formed by extending upwards from both sides of the base portion and clips both sides of the rib, respectively. Besides, the inner sides of both ends of said elastic clip arms form opposite contact surfaces, respectively. Thereby, when an electronic device inserts to the corresponding contact surfaces of each electrical contact, the corresponding contact surfaces of each electrical contact move to the inverse direction that move away from each other, that is, move away from the direction of the rib. Hence, the electrical contact does not interference with the housing, reducing normal forces exerted on the electrical contact due to interference with the housing. Accordingly, the reliability of the product is guaranteed.

The electrical connecting apparatus according to the present invention is set on a circuit board used for providing a plurality of plug portions of an electronic device with electrical contacts, and comprises a housing and a plurality of electrical contacts. At least one passageway is set on the housing. At least two ribs are set in the passageways. Within the passageways, at least one holding space is formed between two adjacent ribs. The electrical contacts are set in the passageways, respectively. In addition, portions of at least two electrical contacts are accommodated in the same holding space. The electrical contact has a base portion located underneath the rib and electrically contacting the circuit board. A pair of elastic clip arms is formed by extending upwards from the base portion and clips both sides of the rib, respectively. Besides, the inner sides of both ends of said elastic clip arms form opposite contact surfaces corresponding to the plug portions of the electronic device, respectively. When the plug portions contact the contact surfaces, the contact surfaces of each said electrical contact move to the inverse direction that move away from each other.

In comparison with the prior art, when said plug portion inserts to the corresponding contact surfaces of each electrical contact according to the present invention, the two corresponding contact surfaces of each electrical contact are forced to move to the inverse direction that move away from each other. Hence, the electrical contact does not interference with the housing, reducing normal forces exerted on the electrical contact due to interference with the housing. Accordingly, the reliability of the product is guaranteed.

DETAILED DESCRIPTION

Figure 1:
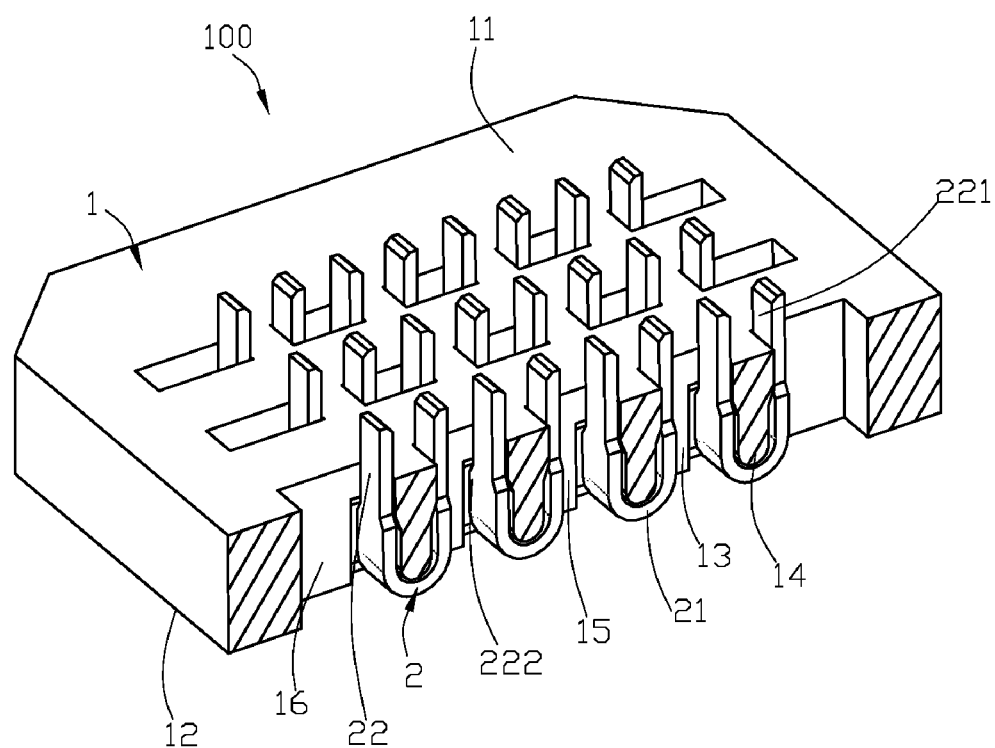
FIG. 1 shows a cross-section view of a novel electrical connecting apparatus according to the first preferred embodiment of the present invention.

In order to make the structure and characteristics as well as the effectiveness of the present invention to be further understood and recognized, the detailed description of the present invention is provided as follows along with preferred embodiments and accompanying figures.

Please referring to FIG. 1 to FIG. 5 show the novel electrical connecting apparatus according to the first preferred embodiment of the present invention. The electrical connecting apparatus 100 according to the present invention is used for electrically connecting a chip module 200 to a circuit board 300, and comprises a housing 1 and a plurality of electrical contacts 2 held in the housing 1.

Figure 2:
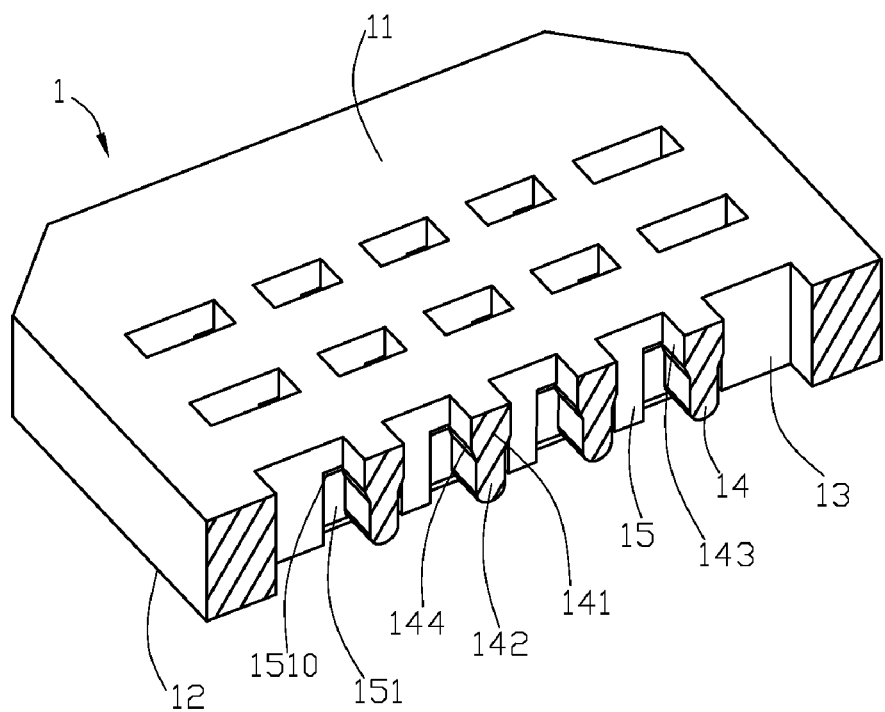
FIG. 2 shows a cross-section view of the housing according to the electrical connecting apparatus of the present invention.

Please referring to FIG. 1 and FIG. 2, said housing 1 has a connection side 11 (which is, in fact, the top surface of the housing 1) close to the chip module 200, and an installation side 12 (which is, in fact, the bottom surface of the housing 1) opposite to the connection side 11 and close to the circuit board 300. The housing 1 has a plurality of passageways 13 used for holding said electrical contacts 2. The plurality of passageways 13 passes through the connection side 11 and the installation side 12. Between the passageways 13, a plurality of ribs 14 is set. In addition, within the passageways 13, a holding space 15 is formed between two adjacent ribs 14 for partially holding two said electrical contacts 2. The ribs 14 are ladder-shaped, and include an upper part 141 and a lower part 142 extending downwards from the upper part 141. The cross-sectional area of the upper part 141 is larger than that of the lower part 142. Both sides of the upper part 141 of the ribs 14 protrude to form touch surfaces 143. An incline 144 is formed at the interface of the upper part 141 and lower part 142 of the rib 14. Thereby, the electrical contact 2 can clip both sides of the rib 14 with ease. Stopping trenches 151 are recessed on both inner sides of the holding space 15, respectively, and pass through to the installation side 12 of the housing 1 for securing the electrical contact 2. The stopping trench 151 has a guiding incline 1510 for installing the electrical contact 2 easily. Besides, spaces 16 are formed between the electrical contacts 2 and the first and final passageways 13, respectively.

Figure 3:
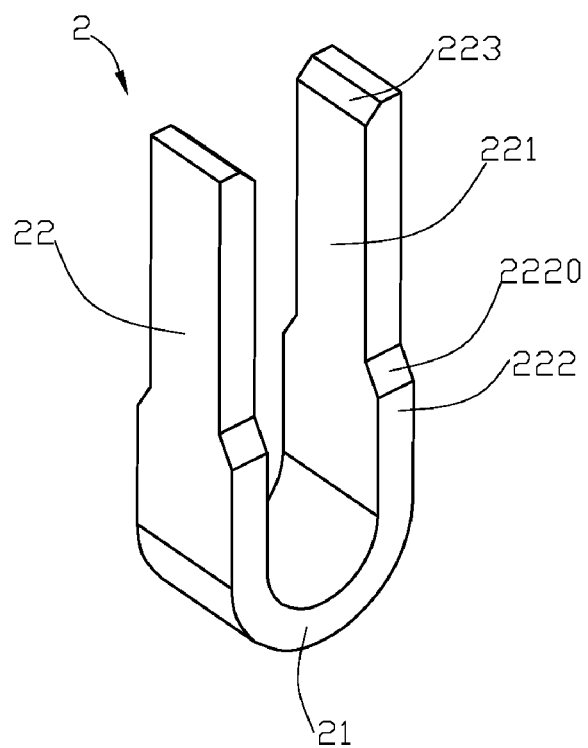
FIG. 3 shows a three-dimensional view of the electrical contact according to the electrical connecting apparatus of the present invention.

Please referring to FIG. 1 and FIG. 3, the electrical contacts 2 are held in the passageways 13. The electrical contacts 2 are U-shaped with a base portion 21. In addition, a pair of contact portion 22 is formed by extending upwards from the base portion 21 along corresponding two sides of the rib 14.

The base portion 21 is located underneath the corresponding rib 14, and used for preventing excessive upward movement of the electrical contact 2. A gap is formed between the base portion 21 and the bottom of the rib 14 for assuring that the base portion 21 does not interfere with the housing 1.

Figure 4:
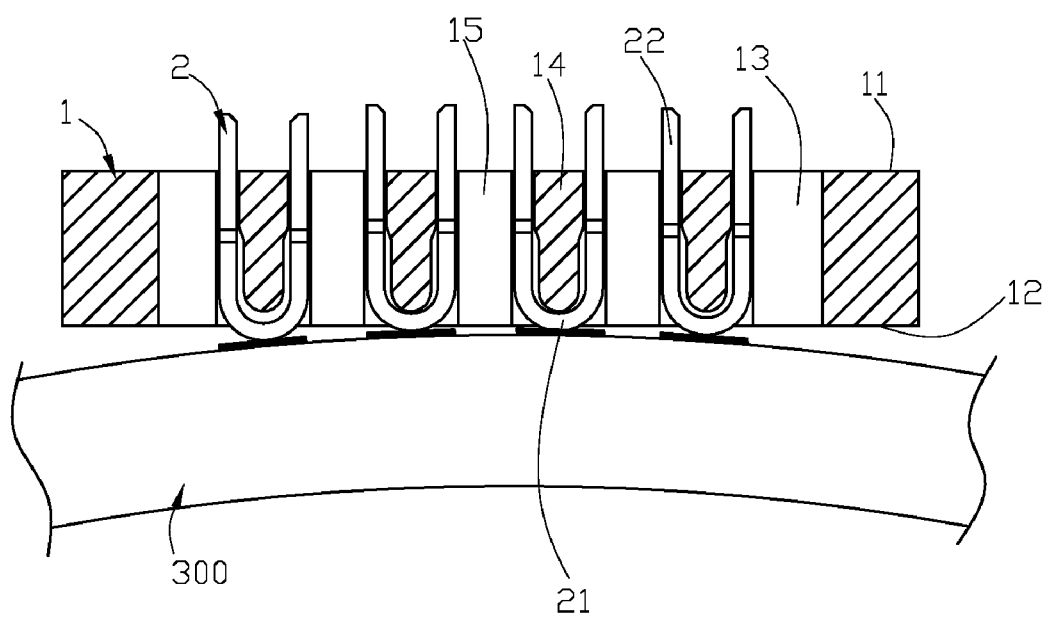
FIG. 4 shows a cross-section view when the electrical connecting apparatus according to the present invention is soldered on a circuit board.
Figure 5:
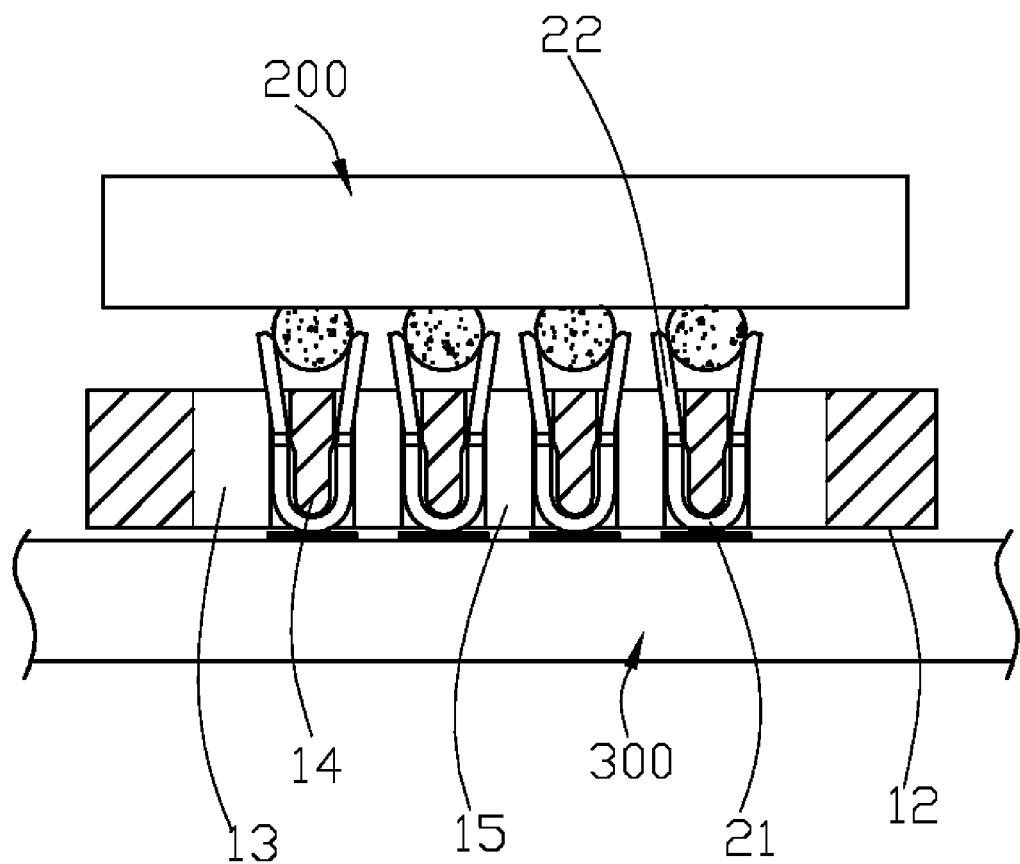
FIG. 5 shows a cross-section view when the electrical connecting apparatus according to the present invention is connected a chip module to a circuit board.

The contact portion 22 has stopping parts 222 formed on both sides thereof and close to the base portion 21, respectively, and matching the stopping trenches 151 for securing the electrical contact 2. The stopping part 222 has a guiding surface 2220 corresponding to the guiding incline 1510. The contact portion 22 is ladder-shaped, and the width thereof is narrowed from the stopping part 222. At the end of the contact portion 22, a chamfer 223 is formed. The pair of contact portions 22 of each electrical contact 2 is symmetrical. The ends of the inner sides of two contact portions 22 form contact surfaces 221 facing to each other, respectively, used for contacting with plug portions 3 (as shown in FIG. 5) of the chip module 200. The contact portions 22 pass through the holding space 15, and the paired contact portions 22 of the electrical contact 2 is located on both sides of the same holding space 15 and clips both sides of the rib 14. When the paired contact portions 22 of the electrical contact 2 makes contact with the plug portions 3 of the chip module 200, the contact portions 22 will move in the direction away from the rib 14, respectively. That is, the contact portions 22 will move towards the center of the holding space 15. Thereby, the electrical contact 2 does not interfere with the housing 1, and the normal force exerted on the electrical contact is reduced. Furthermore, because of the gap between the electrical contact 2 and the housing 1, the electrical contact 2 can move moderately in the passageway 13. Hence, during the process of installing the electrical connecting apparatus 100 on the circuit board 300, if the circuit board 300 cause warpage, the electrical contacts 2 can adjust their positions automatically, ensuring that all the base portions 21 of the electrical contacts can joint with the corresponding pads on the circuit board 300 (as shown in FIG. 4).

Figure 6:
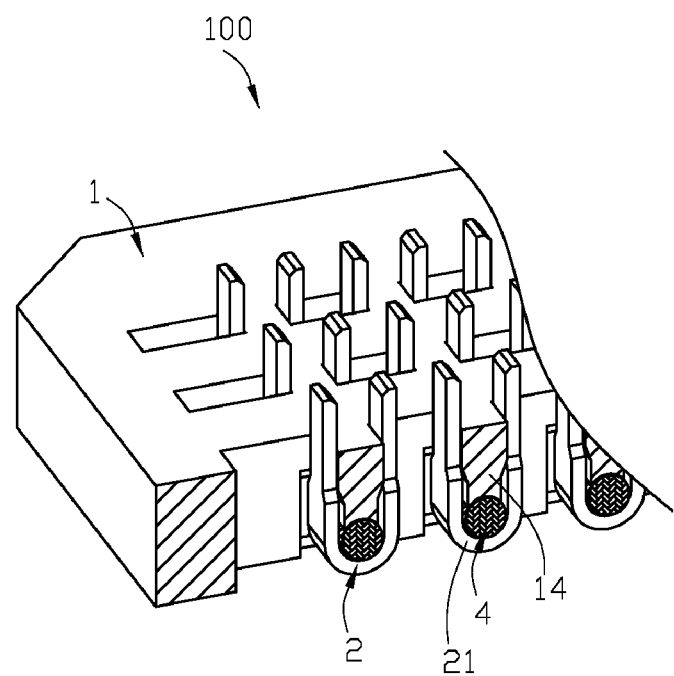
FIG. 6 shows a partial cross-section view of a novel electrical connecting apparatus according to the second preferred embodiment of the present invention.

Please referring to FIG. 6 shows a novel electrical connecting apparatus according to the second preferred embodiment of the present invention. The difference between the present preferred embodiment and the first one is that an elastic body 4 is filled in the gap formed between the base portion 21 of the electrical contact 2 and the bottom of the rib 14. Thereby, the base portion 21 does not contact with the bottom of the rib 14 for assuring that the base portion 21 does not interfere with the housing 1. Because when the paired contact portions 22 of each electrical contact 2 makes contact with the plug portion 3 of the chip module 200, the electrical contact 2 does not interfere with the housing 1, the objective of the first preferred embodiment can be achieved as well.

Figure 7:
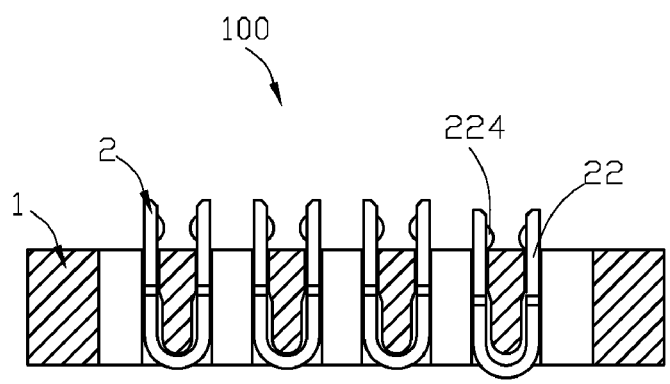
FIG. 7 shows a cross-section view of a novel electrical connecting apparatus according to the third preferred embodiment of the present invention.

Please referring to FIG. 7 shows a novel electrical connecting apparatus according to the third preferred embodiment of the present invention. The difference between the present preferred embodiment and the first one is that opposite nubs 224 are formed face to face on the end inner sides of the paired contact portions 22 of the electrical contact 2. The opposite nubs 224 can form opposite stopping nubs for preventing the electrical contact 22 from falling down. Meanwhile, the opposite nubs 224 can form opposite contact surfaces for enhancing the contact between the electrical contact 2 and the plug portion 3 of the chip module 200. Because when the paired contact portions 22 of each electrical contact 2 makes contact with the plug portion 3 of the chip module 200, the electrical contact 2 does not interfere with the housing 1, the objective of the first preferred embodiment can be achieved as well.

The electrical connecting apparatus according to the present invention has the following advantages:

1. When the paired contact portions of each electrical contact of the electrical connecting apparatus according to the present invention make contact with an electronic device, the electrical contact does not interfere with the housing and thus reducing the normal forces exerted on the electrical contact due to interference with the housing. Consequently, the reliability of the product can be guaranteed.

2. Because of the gap between the electrical contact and the housing, the electrical contact can move moderately in the passageway. Hence, during the process of installing the electrical connecting apparatus on the circuit board, the electrical contacts can adjust their positions automatically, ensuring that all the base portions of the electrical contacts can joint with the corresponding pads on the circuit board.

3. Because the gap between adjacent electrical contacts according to the present invention is made of air, in comparison with plastic isolation according to the prior art, air has a lower permittivity, and thus a better impedance characteristic. Consequently, the reliability of the product can be guaranteed.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. An electrical connecting apparatus, used for providing electric contact for an electronic device, comprising:
   a housing, at least one passageway being set on the housing, at least two ribs being set in the passageways, and within the passageways, at least one holding space being formed between two adjacent ribs; and
   a plurality of electrical contacts, set in the passageways, respectively, portions of at least two electrical contacts being accommodated in the same holding space, the electrical contact having a base portion located underneath the rib, a pair of contact portions being formed by extending upwards from the base portion along corresponding two sides of the rib, at least one contact portion passing through the holding space, and the contact portions moving away from corresponding said rib when the paired contact portions of each said electrical contact make contact with the electronic device.

2. The electrical connecting apparatus of claim 1, wherein at least two adjacent contact portions of the electrical contact are located in both sides of the same holding space.

3. The electrical connecting apparatus of claim 1, wherein a stopping trench passing through to the bottom of the housing is set on at least one sides of the holding space, and at least one stopping part corresponding to the stopping trenches is set on the contact portions.

4. The electrical connecting apparatus of claim 3, wherein a guiding incline is set on the upper sides of the stopping trench, and a guiding surface is set facing the guiding incline on the stopping part.

5. The electrical connecting apparatus of claim 1, wherein when the paired contact portions of each electrical contact make contact with the electronic device, they move towards the center of the holding spaces.

6. An electrical connecting apparatus, set on a circuit board, used for providing electric contact for a plurality of plug portions of an electronic device, comprising:
   a housing, at least one passageway being set on the housing, at least two ribs being set in the passageways, and within the passageways, at least one holding space being formed between two adjacent ribs; and
   a plurality of electrical contacts, set in the passageways, respectively, portions of at least two electrical contacts being accommodated in the same holding space, the electrical contact having a base portion located underneath the rib and electrically contacting the circuit board, a pair of elastic clip arms being formed by extending upwards from the base portion and clipping both sides of the rib, respectively, the inner sides of both ends of said elastic clip arms forming opposite contact surfaces corresponding to the plug portions of the electronic device, respectively, and when the paired contact portions of each said electrical contact make contact with the electronic device, the contact surfaces of each said electrical contact move to the inverse direction that move away from each other.

7. The electrical connecting apparatus of claim 6, wherein opposite nubs are formed protrusively on the opposite contact surfaces of each electrical contact.

8. The electrical connecting apparatus of claim 6, wherein opposite stopping nubs are formed protrusively on the opposite contact surfaces of each electrical contact.

9. The electrical connecting apparatus of claim 6, wherein the contact portions are ladder-shaped.

* * * * *